(12) United States Patent
Muraki et al.

(10) Patent No.: US 8,188,495 B2
(45) Date of Patent: May 29, 2012

(54) GALLIUM NITRIDE-BASED COMPOUND SEMICONDUCTOR LIGHT EMITTING DEVICE

(75) Inventors: Noritaka Muraki, Ichihara (JP); Munetaka Watanabe, Ichihara (JP)

(73) Assignee: Showa Denko K.K., Tokyo (JP)

( * ) Notice: Subject to any disclaimer, the term of this patent is extended or adjusted under 35 U.S.C. 154(b) by 4 days.

(21) Appl. No.: 12/300,302

(22) PCT Filed: Jun. 8, 2007

(86) PCT No.: PCT/JP2007/062063
§ 371 (c)(1),
(2), (4) Date: Nov. 10, 2008

(87) PCT Pub. No.: WO2007/145300
PCT Pub. Date: Dec. 21, 2007

(65) Prior Publication Data
US 2009/0212319 A1 Aug. 27, 2009

(30) Foreign Application Priority Data
Jun. 13, 2006 (JP) .................. 2006-163737

(51) Int. Cl.
*H01L 33/00* (2010.01)
(52) U.S. Cl. .................. 257/98; 257/103; 257/E33.025; 257/E33.028
(58) Field of Classification Search .................. 257/98, 257/103, E33.023, E33.025, E33.028, E33.033, 257/E33.034
See application file for complete search history.

(56) References Cited

U.S. PATENT DOCUMENTS

| 5,864,171 | A | 1/1999 | Yamamoto et al. | |
|---|---|---|---|---|
| 5,994,205 | A | 11/1999 | Yamamoto et al. | |
| 6,307,218 | B1 | 10/2001 | Steigerwald et al. | |
| 7,462,869 | B2 | 12/2008 | Ohashi et al. | |
| 2002/0121637 | A1 | 9/2002 | Ito | |
| 2003/0062529 | A1* | 4/2003 | Kato et al. | 257/79 |
| 2004/0251471 | A1* | 12/2004 | Dwilinski et al. | 257/103 |
| 2005/0093099 | A1* | 5/2005 | Koike et al. | 257/615 |
| 2005/0121688 | A1 | 6/2005 | Nagai et al. | |
| 2005/0133807 | A1 | 6/2005 | Park et al. | |
| 2005/0253157 | A1 | 11/2005 | Ohashi et al. | |
| 2006/0017061 | A1* | 1/2006 | Sakamoto et al. | 257/103 |
| 2006/0049335 | A1 | 3/2006 | Suehiro et al. | |
| 2006/0151798 | A1 | 7/2006 | Nitta et al. | |
| 2006/0220043 | A1* | 10/2006 | Kim et al. | 257/96 |
| 2006/0258027 | A1* | 11/2006 | Ohmae et al. | 438/22 |
| 2007/0205490 | A1 | 9/2007 | Kusunoki | |

FOREIGN PATENT DOCUMENTS

| JP | 07-131069 A | 5/1995 |
|---|---|---|
| JP | 07-142763 A | 6/1995 |
| JP | 08-330628 A | 12/1996 |

(Continued)

*Primary Examiner* — Cuong Q Nguyen
*Assistant Examiner* — Tran Tran
(74) *Attorney, Agent, or Firm* — Sughrue Mion, PLLC

(57) ABSTRACT

An object of the present invention is to provide a gallium nitride-based compound semiconductor light emitting device having excellent light extraction efficiency and a high emission output in which a planar shape is a rectangular shape with vertical and longitudinal sides each having a different length. The present light emitting device comprises a substrate and a gallium nitride-based compound semiconductor layer formed on the substrate, wherein a planar shape is a rectangular shape with vertical and longitudinal sides each having a different length, and a side surface of the gallium nitride-based compound semiconductor layer is not vertical to a principal surface of the substrate.

8 Claims, 6 Drawing Sheets

FOREIGN PATENT DOCUMENTS

| | | |
|---|---|---|
| JP | 10-27769 A | 1/1998 |
| JP | 10-189480 A | 7/1998 |
| JP | 10-275942 A | 10/1998 |
| JP | 11-126763 A | 5/1999 |
| JP | 11-224866 A | 8/1999 |
| JP | 11-274560 A | 10/1999 |
| JP | 2000-164930 A | 6/2000 |
| JP | 2001-320091 A | 11/2001 |
| JP | 2002-100791 A | 4/2002 |
| JP | 2003-110136 A | 4/2003 |
| JP | 2004-103672 A | 4/2004 |
| JP | 2004-281445 A | 10/2004 |
| JP | 2005-150673 A | 6/2005 |
| JP | 2005-183910 A | 7/2005 |
| JP | 2005-191551 A | 7/2005 |
| JP | 2005-268329 A | 9/2005 |
| JP | 2005327979 A | 11/2005 |
| JP | 2006-086489 A | 3/2006 |
| JP | 2006-093594 A | 4/2006 |
| JP | 2006-128457 A | 5/2006 |
| KR | 20030074432 A | 9/2003 |
| WO | 2005/096399 A1 | 10/2005 |

\* cited by examiner

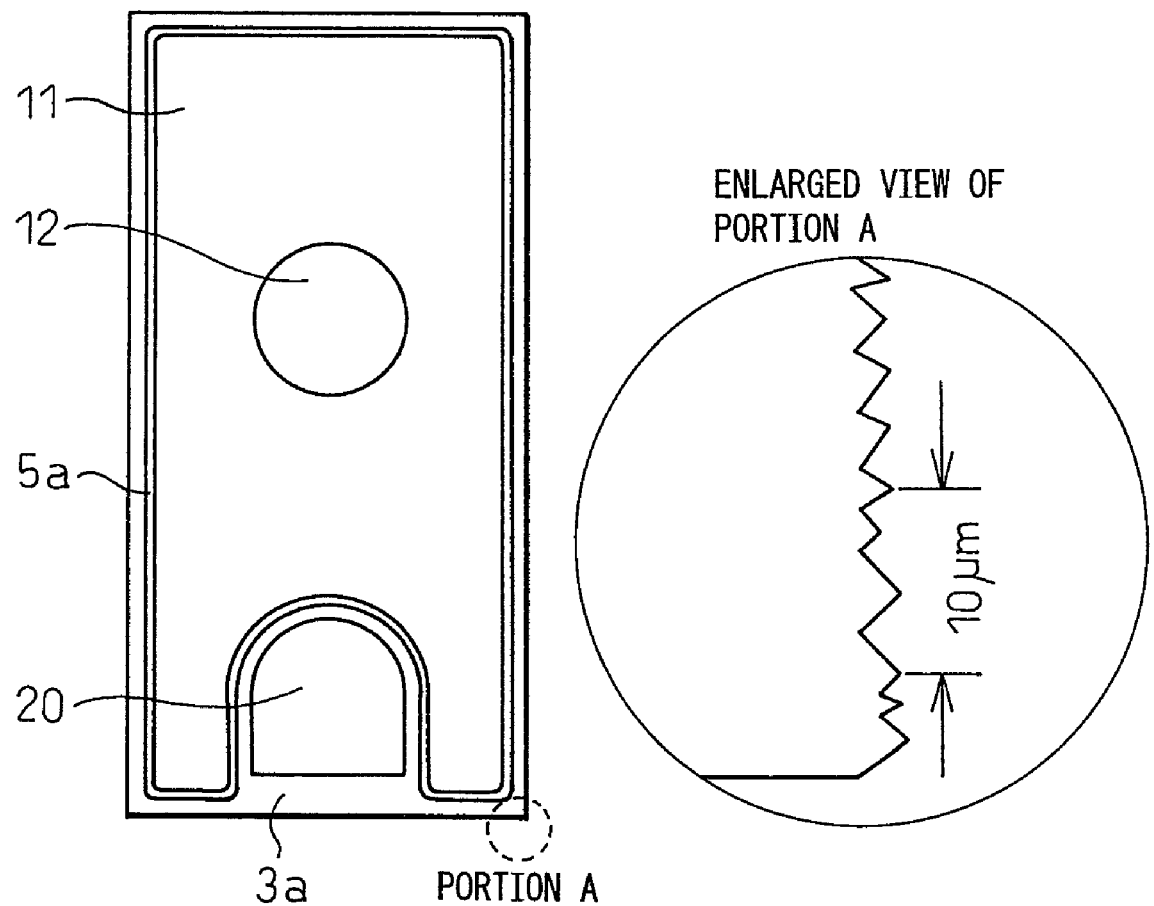

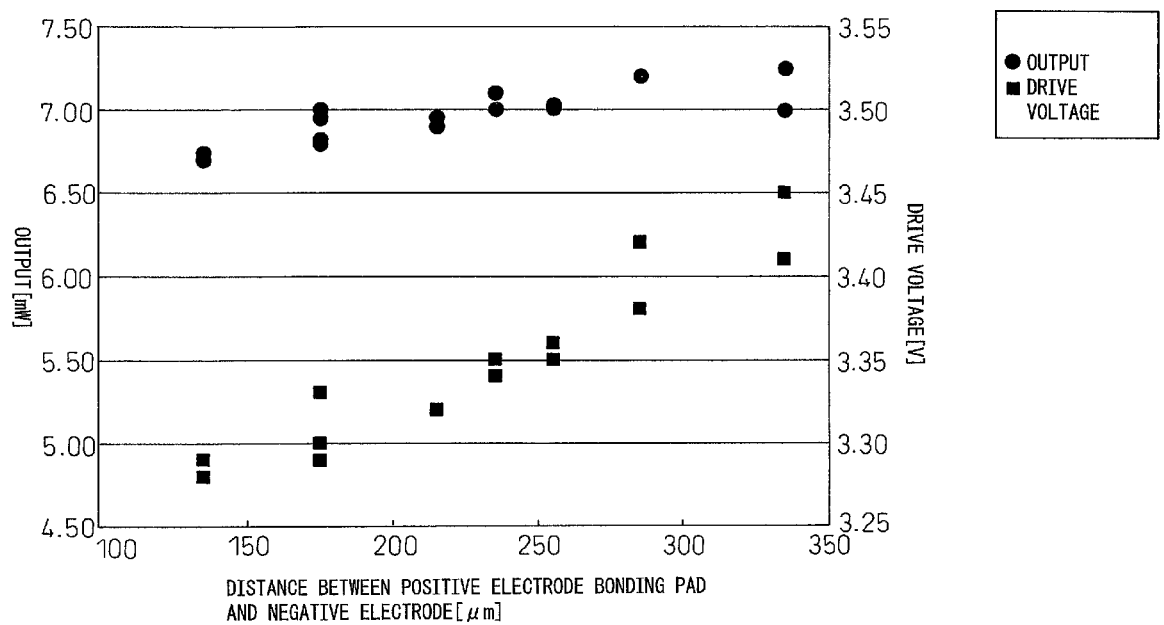

GALLIUM NITRIDE-BASED COMPOUND SEMICONDUCTOR LIGHT EMITTING DEVICE

CROSS REFERENCE TO RELATED APPLICATION

This application is a National Stage of International Application No. PCT/JP2007/062063 filed Jun. 8, 2007, claiming priority based on Japanese Patent Application No. 2006-163737, filed Jun. 13, 2006, the contents of all of which are incorporated herein by reference in their entirety.

TECHNICAL FIELD

The present invention relates to a gallium nitride-based compound semiconductor light emitting device, and more specifically, to a gallium nitride-based compound semiconductor light emitting device in which a planar shape is a rectangular shape with vertical and longitudinal sides, each having a different length.

BACKGROUND ART

Gallium nitride-based compound semiconductor materials have become of major interest recently as a semiconductor material for a short-wavelength light emitting device. A gallium nitride-based compound semiconductor is formed on various substrates made of oxides, principally a sapphire single crystal, and III-V group compounds using a metal-organic chemical vapor deposition method (MOCVD method) or a molecular beam epitaxy method (MBE method).

In a gallium nitride-based compound semiconductor light emitting device, light from a light-emitting layer is efficiently emitted to the outside using, as a positive electrode, a transparent electrode such as an ITO electrode and an AuNi transparent electrode. In order to improve light emission efficiency, various LED chips have been proposed with a design arranging electrodes such as a pad electrode on a transparent electrode and a negative electrode on an n-type layer (for example, refer to Japanese Unexamined Patent Publication (Kokai) No. 2005-19646).

The modularization of LED chips results in a higher need for replacement of a conventional square shape with a rectangular shape, especially a modified shape, so as to make efficient use of space, for the following reason. In a chip where light is irradiated in a lateral direction, a square shape is inefficient with respect to mounting, and therefore a rectangular shape capable of decreasing the height of a module is desired. However, in an LED chip having a rectangular shape, a distance between electrodes and an electrode shape results in a problem such as a deterioration in the high light extraction efficiency which could be achieved in the prior art. For example, in Japanese Unexamined Patent Publication (Kokai) No. 2004-221529, an opaque electrode for diffusion is formed on a transparent electrode which is originally formed so as to extract light, thus sacrificing an emission output of the entire light emitting device.

DISCLOSURE OF THE INVENTION

An object of the present invention is to solve the above-described problems and to provide a gallium nitride-based compound semiconductor light emitting device having excellent light extraction efficiency and a high emission output in which a planar shape is a rectangular shape with vertical and longitudinal sides each having a different length.

The present invention provides the following inventions.

(1) A light emitting device comprising a substrate and a gallium nitride-based compound semiconductor layer formed on the substrate, wherein a planar shape is a rectangular shape with vertical and longitudinal sides each having a different length, and a side surface of the gallium nitride-based compound semiconductor layer is not vertical to a principal surface of the substrate.

(2) The gallium nitride-based compound semiconductor light emitting device according to the above-described 1, wherein an angle θ between the side surface of the gallium nitride-based compound semiconductor layer and a principal surface of the substrate is less than 90°.

(3) The gallium nitride-based compound semiconductor light emitting device according to the above-described 1 or 2, wherein the substrate is a sapphire C-plane substrate.

(4) The gallium nitride-based compound semiconductor light emitting device according to the above-described 3, wherein the side surface at a rectangular long side of the gallium nitride-based compound semiconductor layer corresponds to a plane direction other than an M-plane in a gallium nitride single crystal lattice.

(5) The gallium nitride-based compound semiconductor light emitting device according to any one of the above-described 1 to 4, wherein the length of the long side is from 50 μm to 2,000 μm.

(6) The gallium nitride-based compound semiconductor light emitting device according to any one of the above-described 1 to 5, wherein a ratio of the short side to the long side is from 1:10 to 4:5.

(7) The gallium nitride-based compound semiconductor light emitting device according to any one of the above-described 1 to 6, wherein the positive electrode bonding pad is located in the center of a rectangular long side.

(8) A method for producing a light emitting device comprising a substrate and a gallium nitride-based compound semiconductor layer formed on the substrate, wherein a planar shape is a rectangular shape with vertical and longitudinal sides each having a different length, the method comprising the steps of covering a surface of the gallium nitride-based compound semiconductor layer with a mask having a predetermined pattern; removing the gallium nitride-based compound semiconductor layer at a site to be split into devices so as to reach the substrate; subjecting to wet etching treatment after removal; and splitting into each device.

(9) The method for producing a gallium nitride-based compound semiconductor light emitting device according to the above-described 8, wherein the mask is a photoresist.

(10) The method for producing a gallium nitride-based compound semiconductor light emitting device according to the above-described 8 or 9, wherein the step of removing the gallium nitride-based compound semiconductor layer is performed by a laser.

(11) The method for producing a gallium nitride-based compound semiconductor light emitting device according to the above-described 8 or 9, wherein the step of removing the gallium nitride-based compound semiconductor layer is performed by a dicing machine.

(12) The method for producing a gallium nitride-based compound semiconductor light emitting device according to any one of the above-described 8 to 11, wherein the wet etching treatment is performed using orthophosphoric acid.

(13) A lamp comprising the gallium nitride-based compound semiconductor light emitting device according to any one of the above-described 1 to 7.

(14) An electronic equipment comprising the lamp according to the above-described 13 assembled therein.

(15) A machinery comprising the electronic equipment according to the above-described 14 assembled therein.

In the gallium nitride-based compound semiconductor light emitting device in which a planar shape is a rectangular shape with vertical and longitudinal sides each having a different length, inclination of the side surface of the semiconductor layer enables an increase in an amount of light transmitted through the side surface or an amount of light reflected on the side surface to be extracted outside from the other surface, and thus light extraction efficiency is improved.

Furthermore, using a substrate having a principal surface composed of a sapphire C-plane substrate, by allowing the side surface at the rectangular long side of the semiconductor layer to correspond to a plane direction other than M-plane in a gallium nitride single crystal lattice, light extraction efficiency is remarkably improved.

By processing the side surface of the gallium nitride-based compound semiconductor layer formed on a hard-to-work substrate such as a sapphire substrate by wet etching, a less damaged light emitting device can be obtained.

BRIEF DESCRIPTION OF THE DRAWINGS

FIG. 6 is a schematic view showing a side surface shape of a gallium nitride-based compound semiconductor light emitting device produced in Example 1.

FIG. 7 is a graph showing a relationship between the distance between a positive electrode bonding pad and a negative electrode, and the characteristics of a light emitting device obtained in Example 2.

BEST MODE FOR CARRYING OUT THE INVENTION

The present invention is characterized in that a gallium nitride-based compound semiconductor light emitting device in which a planar shape is a rectangular shape with vertical and longitudinal sides each having a different length enables a remarkable improvement in light extraction efficiency by forming a device structure in which a side surface of a semiconductor layer is not vertical to a principal surface of a substrate (hereinafter referred to as inclination). The present invention is also characterized in that a long side surface is formed into a shape suited for extraction of light by utilizing a difference in ease of chemical etching of each crystal plane of a gallium nitride-based compound semiconductor crystal.

The present invention will be described in detail with reference to the accompanying drawings.

Figure 1:
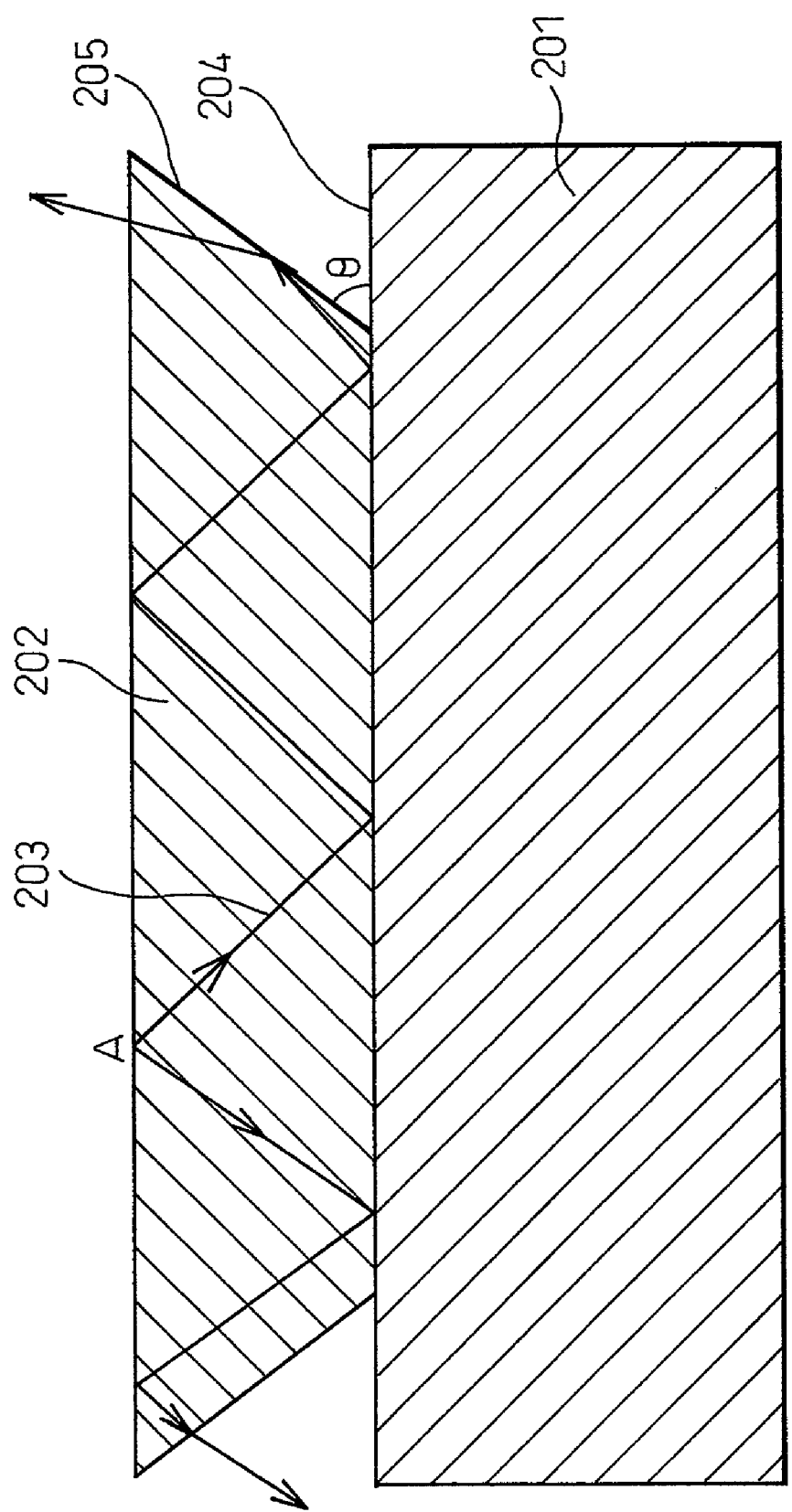
FIG. 1 is a sectional view schematically showing an example of propagation of light in a gallium nitride-based compound semiconductor light emitting device of the present invention.
Figure 2:
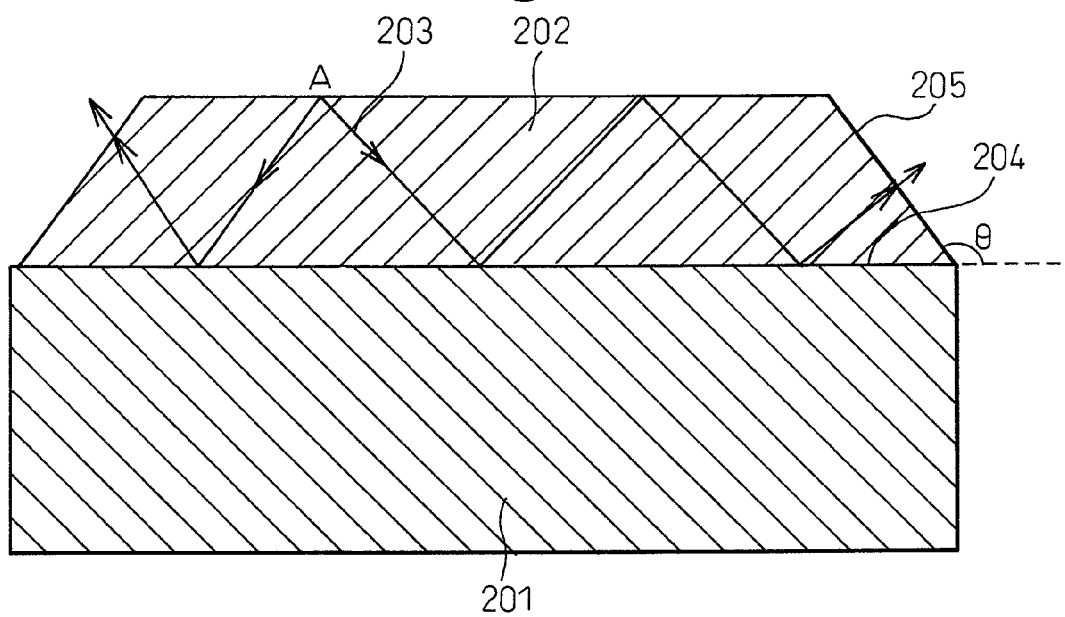
FIG. 2 is a sectional view schematically showing an example of propagation of light in a gallium nitride-based compound semiconductor light emitting device according to another aspect of the present invention.

FIG. 1 is a sectional view schematically showing an example of propagation of light in a gallium nitride-based compound semiconductor light emitting device of the present invention, and shows the case where an angle θ between a side surface of a semiconductor layer and a principal surface of the substrate is less than 90°. FIG. 2 is a sectional view schematically showing an example of propagation of light in a gallium nitride-based compound semiconductor light emitting device according to another aspect of the present invention, and shows the case where an angle θ between a side surface of a semiconductor layer and a principal surface of the substrate is more than 90°. In these drawings, numeral 204 denotes a principal surface of a substrate (201), 205 denotes a side surface of a gallium nitride-based compound semiconductor layer (202), and an angle between them is θ. The numeral 203 denotes a propagation route of light emitted at the point A in a semiconductor.

Figure 3:
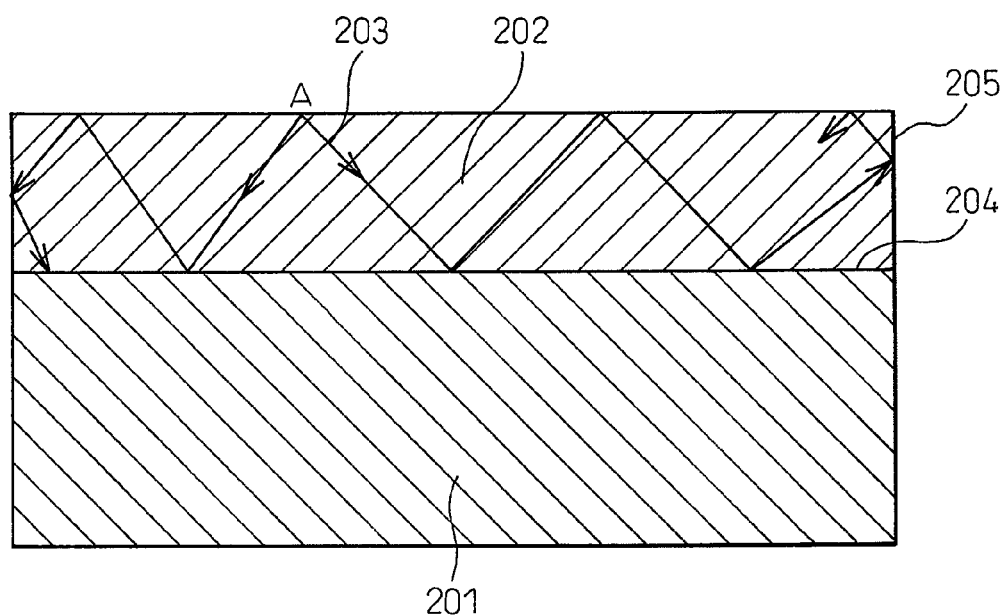
FIG. 3 is a sectional view schematically showing an example of propagation of light in a conventional gallium nitride-based compound semiconductor light emitting device.

FIG. 3 is a sectional view schematically showing an example of propagation of light in a conventional gallium nitride-based compound semiconductor light emitting device, and shows the case where a side surface of a semiconductor layer is vertical to a principal surface of a substrate. In the drawing, the numerals are the same as those in FIGS. 1 and 2.

It is not entirely clear why light extraction efficiency increases when the side surface of the semiconductor layer inclines with respect to the principal surface of the substrate, as in the present invention. However it is hypothesized to be as follows.

FIG. 3 shows a conventional gallium nitride-based compound semiconductor light emitting device. In case where light emitted at the point A propagates on the route shown by the arrow, light is reflected when an incident angle of light incident on the side surface of the semiconductor layer is a critical angle or more. On the top surface of the semiconductor layer, an incident angle of light is also more than the critical angle and thus light is reflected. As a result, light extraction efficiency decreases.

In contrast, in the case of FIG. 1, although light is reflected on the side surface of the semiconductor layer, light is transmitted since the incident angle is within the critical angle on the top surface of the semiconductor layer, and thus light can be extracted from the light emitting device. In FIG. 1, the inclination angle θ is less than 90°. The inclination angle θ is preferably 10° or more and 80° or less, and more preferably 30° or more and 70° or less.

In the case of FIG. 2, since the incident angle is within the critical angle on the side surface of the semiconductor layer, light is transmitted through the semiconductor layer.

In both cases of FIGS. 1 and 2, light extraction efficiency increases. As shown in FIG. 1, it is preferred that the angle θ between the side surface of the semiconductor layer and the principal surface of the substrate is less than 90° since there is a higher probability that light propagating to the side surface of the semiconductor layer is reflected on the side surface and is propagated upwardly.

As described above, in the present invention, light extraction efficiency is increased utilizing the side surface of the light emitting device. Therefore, when the area (planar project area) is the same, a light emitting device having a larger side surface is more advantageous. In other words, a light emitting device having a larger ratio of a peripheral length to a planar project area is more advantageous.

In the case of a rectangle, a ratio of a peripheral length to the area of a rectangle with facing sides each having a different length is larger than that of a square with sides each having the same length.

Therefore, the effect of improving light extraction efficiency exerted by inclination of the side surface of the semiconductor layer of the light emitting device to the principal surface of the substrate increases when the planar shape of the light emitting device is a rectangular shape with vertical and longitudinal sides each having a different length.

The planar shape of the light emitting device of the present invention is not particularly limited when the shape is a rectangular shape with vertical and longitudinal sides each having a different length. To sum up, the light emitting device can have any shape corresponding to an electronic equipment into which the light emitting device is assembled.

The larger a ratio of the short side to the long side of the rectangle, the better. The reason is that the ratio of the peripheral length to the area increases when the ratio of the short side to the long side increases. However, when the ratio is too large, the light emitting device becomes too long and narrow, and thus it is difficult to dispose a positive electrode and a negative electrode, or a drive voltage increases. Therefore, the ratio of the short side to the long side of the light emitting device of the present invention is preferably from 1:10 to 4:5, and more preferably from 1:2 to 2:3.

Taking into account the arrangement of the positive electrode and negative electrode, and the workability in the production of the light emitting device and current distribution, an absolute length of the long side is preferably from 50 to 2,000 μm, and more preferably from 200 to 600 μm. An absolute length of the short side is preferably from 40 to 1,000 μm, and more preferably from 100 to 300 μm.

Figure 4:
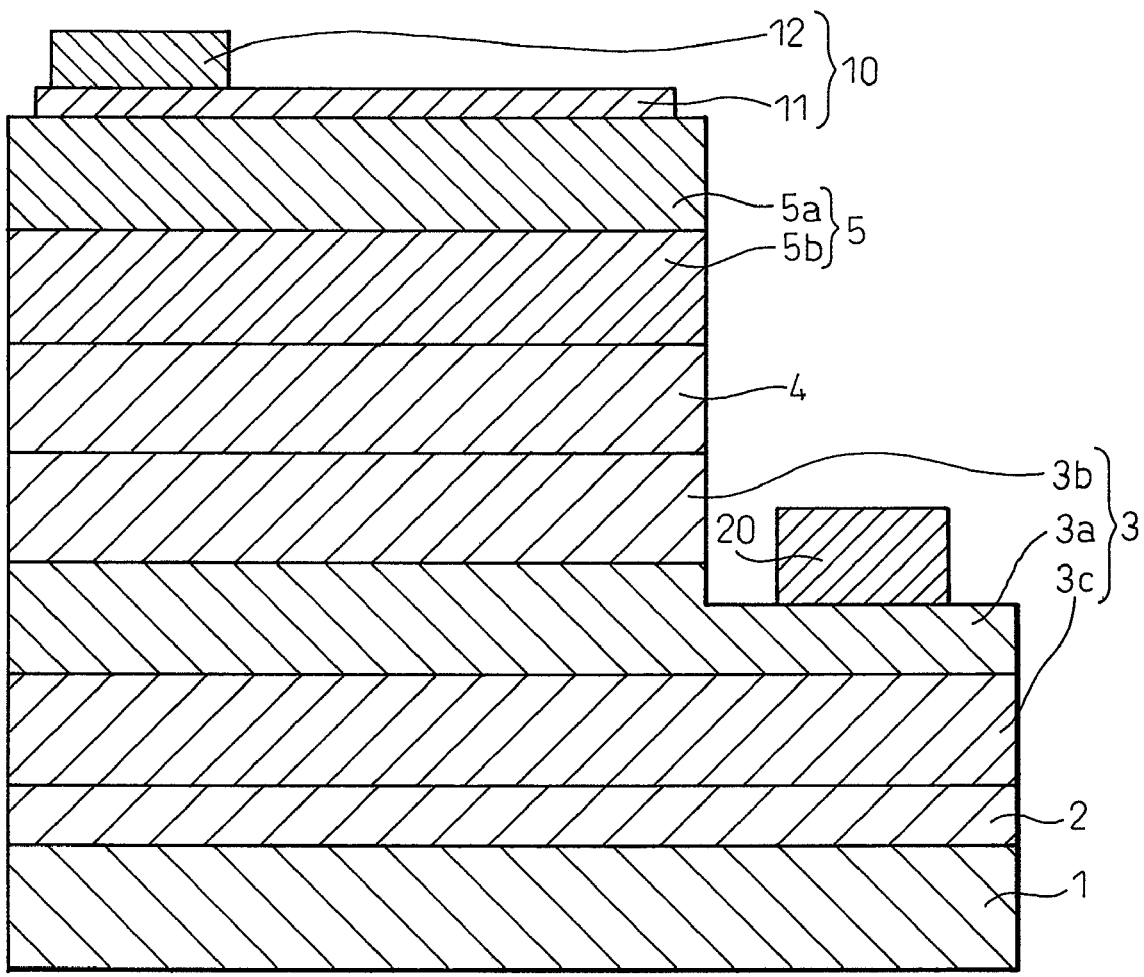
FIG. 4 is a view schematically showing a usual layered structure of a gallium nitride-based compound semiconductor light emitting device.

As a layered structure of a gallium nitride-based compound semiconductor light emitting device, for example, a layered structure shown in FIG. 4 is known and a layered structure of the gallium nitride-based compound semiconductor light emitting device of the present invention may be any layered structure including such a known layered structure. In FIG. 4, the numeral 1 denotes a substrate, 2 denotes a buffer layer, and 3 denotes an n-type semiconductor layer. The n-type semiconductor layer is composed of an underlying layer (3c), an n-type contact layer (3a) and an n-type clad layer (3b). The numeral 4 denotes a light-emitting layer and 5 denotes a p-type semiconductor layer. The p-type semiconductor layer is composed of a p-type clad layer (5b) and a p-type contact layer (5a). The numeral 10 denotes a positive electrode and is composed of a transparent positive electrode (11) and a positive electrode bonding pad (12). The numeral 20 denotes a negative electrode.

In the present invention, it is possible to use, as the material of the substrate 1, a known substrate material selected from oxide single crystals such as sapphire single crystal ($Al_2O_3$; A-plane, C-plane, M-plane, R-plane), spinel single crystal ($MgAl_2O_4$), ZnO single crystal, $LiAlO_2$ single crystal, $LiGaO_2$ single crystal, MgO single crystal and $Ga_2O_3$ single crystal; and nonoxide single crystals such as Si single crystal, SiC single crystal, GaAs single crystal, AlN single crystal, GaN single crystal and boride single crystal such as $ZrB_2$ single crystal without any limitation. Among these materials, sapphire single crystal or SiC single crystal is preferred. The crystal plane of the substrate may be inclined toward to a specific crystal plane or not inclined.

It is known that, when a sapphire single crystal is used as the material of the substrate, the gallium nitride-based compound semiconductor single crystal grown on the substrate grows in the direction in accordance with the sapphire single crystal ($Al_2O_3$; A-plane, C-plane, M-plane, R-plane).

When etching from the C axis direction is performed with respect to the surface vertical to the C-plane of the gallium nitride-based compound semiconductor single crystal grown using the C-plane of the sapphire single crystal as the substrate, unevenness tends to form in planes other than the M-plane, for example, in the A-plane, in which the vertex of the crystal is exposed. In contrast, the M-plane tends to flatten. In the present invention, since the side surface of the light emitting device is utilized for improvement of light extraction efficiency, the surface area of the side surface increases when the side surface has unevenness, and thus light extraction efficiency is further improved. Therefore, in the light emitting device of the present invention, the rectangular long side may be a plane other than the M-plane, for example, it may be the A-plane.

As the gallium nitride-based compound semiconductor which constitutes a buffer layer, an n-type semiconductor layer, a light-emitting layer and a p-type semiconductor layer, for example, semiconductors having various compositions represented by the general formula: $Al_xIn_yGa_{1-x-y}N$ ($0 \leq x \leq 1$, $0 \leq y \leq 1$, $0 \leq x+y \leq 1$) are known. In the III group nitride semiconductor which constitutes a buffer layer, an n-type semiconductor layer, a light-emitting layer and a p-type semiconductor layer in the present invention, semiconductors having various compositions represented by the general formula: $Al_xIn_yGa_{1-x-y}N$ ($0 \leq x \leq 1$, $0 \leq y \leq 1$, $0 \leq x+y \leq 1$) can be used without any limitation.

Examples of the method for growing these III group nitride semiconductors include a metal-organic chemical vapor deposition method (MOCVD method), a molecular beam epitaxial growth method (MBE method) and a hydride vapor phase epitaxy method (HVPE method). The method is preferably a MOCVD method which enables easy control of the composition and has throughput, but is not limited thereto.

When the MOCVD method is employed as the method for growing the semiconductor layer, an organometallic material such as trimethyl gallium (TMGa) or triethyl gallium (TEGa) is mainly used as a raw material of Ga of the III group, and trimethyl aluminum (TMAl) or triethyl aluminum (TEAl) is mainly used as a raw material of Al of the same III group. When In is used as a material constituting the light-emitting layer, trimethyl indium (TMI) or triethyl indium (TEI) is used as a raw material thereof. As an N source of the group V, ammonia ($NH_3$) or hydrazine ($N_2H_4$) is used.

In the n-type semiconductor layer, Si or Ge is used as a dopant material. Monosilane ($SiH_4$) or disilane ($Si_2H_6$) is used as a Si raw material, and germanium ($GeH_4$) or an organogermanium compound is used as a Ge raw material. In the p-type semiconductor layer, Mg is used as a dopant. As a raw material thereof, for example, biscyclopentadienyl magnesium ($Cp_2Me$) or bisethylclopentadienyl magnesium (($EtCp)_2Mg$) is used.

In order to form a layer of a gallium nitride-based compound semiconductor on the above substrate, for example, lattice mismatch crystal epitaxial growth techniques called a low-temperature buffer method disclosed in Japanese Patent No. 3,026,087 and Japanese Unexamined Patent Publication (Kokai) No. 4-297023, and a seeding process (SP) disclosed in Japanese Unexamined Patent Publication (Kokai) No. 2003-243302 can be used.

When lattice mismatch crystal epitaxial growth techniques called the low temperature buffer method and SP method are used, the gallium nitride-based compound semiconductor as an underlying layer formed on the buffer layer is preferably an undoped or low-doped (concentration of about $5 \times 10^{-17}$ $cm^{-3}$) GaN. The thickness of the underlying layer is preferably from 1 to 20 μm, and more preferably from 5 to 15 μm.

In order to contact with a negative electrode thereby supplying a current, an n-type contact layer made an n-type GaN is grown on the underlying layer. The n-type GaN is grown while supplying an n-type dopant so as to attain a doping concentration of $1 \times 10^{-18}$ cm$^{-3}$ to $1 \times 10^{-19}$ cm$^{-3}$. The n-type dopant is usually selected from Si and Ge. Doping may be performed by uniform doping, or low doping and high doping may be periodically repeated. In particular, the latter intermittent doping is effective for suppression of pits generated during crystal growth.

It is preferred to form an n-type clad layer between an n-type contact layer and a light-emitting layer. Although the n-type clad layer can be formed from AlGaN, GaN or InGaN, when the layer is formed from InGaN, it is obviously preferred to employ a composition which enables a larger bandgap than an active layer formed from InGaN. The carrier concentration of the n-type clad layer may be the same as, or more or less than that of the n-type contact layer.

It is preferred that the light-emitting layer on the n-type clad layer has a quantum well structure. The light-emitting layer may have a single quantum well structure comprising only one well layer, or a multiple quantum well structure comprising plural well layers. Among these structures, the multiple quantum well structure is preferred as a structure of a device using the gallium nitride-based compound semiconductor since it is possible to have both a high output and a low drive voltage. In the case of the multiple quantum well structure, the entire layer of a combination of a well layer (active layer) and a barrier layer is called a light-emitting layer in the present description.

The p-type semiconductor layer usually has a thickness of 0.01 to 1 μm, and is composed of a p-type clad layer formed in contact with the light-emitting layer, and a p-type contact layer for formation of a positive electrode. The p-type clad layer can serve as the p-type contact layer. The p-type clad layer is formed by using GaN or AlGaN, and is doped with Mg as a p dopant.

As the negative electrode, for example, negative electrodes having various compositions and structures are known and these known negative electrodes can be used without any limitation. As the contact material for a negative electrode, which is contacted with the n-type contact layer, Cr, W and V can be used, in addition to Al, Ti, Ni and Au. Bonding properties can be imparted to the entire negative electrode as a multilayered structure as a matter of course. It is particularly preferred to coat the outermost surface with Au so as to facilitate bonding.

As the positive electrode, for example, positive electrodes having various compositions and structures are known and these known positive electrodes can be used without any limitation.

A transparent positive electrode material may contain Pt, Pd, Au, Cr, Ni, Cu, Co or the like. It is known that transparency is improved by employing a partially oxidized structure. Also, a conventional conductive oxide such as ITO, IZO, IWO or the like may be used as a transparent electrode. As a reflective positive electrode material, for example, Rh, Ag, Al or the like can be used in addition to the above-described materials.

After forming a light transmitting or reflecting positive electrode, a positive electrode bonding pad constituting a bonding pad portion is usually formed on a portion of the surface. The positive electrode is composed of the light transmitting or reflecting positive electrode and the positive electrode bonding pad. As the material of the positive electrode bonding pad, for example, materials having various structures are known. In the present invention, these known materials can be used without any limitation. In addition to Al, Ti, Ni and Au used as the negative electrode material, Cr, W and V can be used without any limitation. However, it is preferable to use materials which have good adhesion with the light transmitting or reflecting positive electrode used. It is necessary that the thickness is large so that stress upon bonding does not exert damage on the light transmitting or reflecting positive electrode. It is preferred that the outermost layer is formed from a material having good adhesion with a bonding ball, for example, Au.

In order to extract light emitted at the lower portion of the positive electrode bonding pad from the side of device to the maximum, the positive electrode bonding pad is preferably formed in the vicinity of the center of the rectangular long side. By disposing the positive electrode bonding pad in the center of the rectangular long side, for example, at the position shifted from the center by ±30%, a current diffusion path decreases and thus a drive voltage of the device can be decreased.

Since a wafer comprising a substrate, and a gallium nitride-based compound semiconductor, a negative electrode and a positive electrode formed on the substrate is separated into each light emitting device and the side surface of the semiconductor layer is inclined, a resist pattern is first formed so as to coat the positive electrode, the negative electrode and the exposed p-type semiconductor layer.

In that case, when a plane direction of the side surface is the M-plane of the gallium nitride-based compound semiconductor crystal, the side surface is flat. In contrast, when the plane direction of the side surface is a plane other than the M-plane of the gallium nitride-based compound semiconductor crystal, the side surface is uneven. When the rectangular long side is a plane other than the M-plane, a light emitting device having excellent light extraction efficiency can be obtained.

The resist may be a positive or negative resist. Using a photomask having a proper pattern, lithography is performed by a conventional procedure so as to expose a boundary of each device including a positive electrode and a negative electrode. Lithography is not necessarily required if each device can be distinguished after coating the electrode and the p-type semiconductor layer with the resist. The thickness is preferably from 0.1 μm to 20 μm. A low thickness may cause peeling of a film upon wet etching, while a high thickness may cause a problem such on resolution of the lithograph, or may make a recognition of a lower pattern difficult. The thickness is preferably from 0.5 μm to 10 μm, and more preferably from 1 μm to 5 μm.

Removal up to the substrate of the gallium nitride-based compound semiconductor is preferably performed by laser. By selecting a laser having a shorter wavelength than that of an absorption edge of the gallium nitride-based compound semiconductor, a machining position is limited to a laser irradiation position since the gallium nitride-based compound semiconductor has a high absorption coefficient of $10^5$ cm$^{-1}$. By properly selecting an optical system of laser, machining at a narrow width of less than 10 μm can also be performed and thus a device yield is improved. The laser machining depth of the substrate can be optionally set to 1 μm or more. When the machining depth is less than the above range, poor shape of the subsequent splitting treatment may occur. When the machining depth is more than 10 μm, the occurrence of defects is suppressed. The machining depth is more preferably 20 μm or more.

Alternately, removal can be performed by a method using a dicing machine, which is a mechanical method. In this case, chipping and cracking of the device can be suppressed by preferable selection of a blade to be used for cutting and possible control of an amount of biting to the substrate. The amount is optionally selected within a range from 1 µm to 50 µm, preferably from 1 µm to 20 µm, and more preferably from 1 µm to 10 µm.

Next, the splitting site is subjected to wet etching to form a recess portion (split groove). Wet etching is performed using orthophosphoric acid. Orthophosphoric acid is placed in a beaker in a predetermined heater, followed by heating to a temperature of 100° C. to 400° C. When a heating temperature is low, an etching rate is low. In contrast, when the heating temperature is too high, peeling occurs in a mask. The heating temperature is preferably from 150° C. to 300° C., and more preferably from 180° C. to 240° C. When the heating temperature is within the above range, it is possible to obtain sufficient compatibility between the etching rate and durability of the mask. This wet etching enables formation of the side surface of the semiconductor layer, inclined to the principal surface of the substrate.

Next, separation into each light emitting device is performed.

The light emitting device may be in the form of a so-called face up (FU) type light emitting device in which emitted light is extracted from the semiconductor side using a transparent positive electrode, or a so-called flip chip (FC) type light emitting device in which emitted light is extracted from the substrate side using a reflective positive electrode.

The gallium nitride-based compound semiconductor light emitting device of the present invention can be provided with a transparent cover by means known in the art to produce a lamp. A white lamp can also be produced by using the gallium nitride-based compound semiconductor light emitting device of the present invention in combination with a cover comprising a fluorescent material.

Since the lamp produced from the gallium nitride-based compound semiconductor light emitting device of the present invention has a high emission output and a low drive voltage, electronic equipment comprising the lamp produced by this technique assembled therein, such as cellular phones, displays and panels; and machinery comprising the electronic equipment assembled therein, such as automobiles, personal computers and gaming machines can be driven at a low power, and thus high quality can be realized. Particularly in battery driving equipments such as cellular phones, gaming machines, toys and automobile components, power-consumption efficiency is realized.

EXAMPLES

The present invention will be described in detail by way of Examples and Comparative Example, but the present invention is not limited only to the following Examples.

Example 1

Using a c-plane sapphire substrate as a substrate, a buffer layer of AlN was formed thereon in accordance with the method described in Japanese Unexamined Patent Publication (Kokai) No. 2003-243302. On the buffer layer, a 6 µm thick underlying layer of undoped GaN, a 4 µm thick periodically Ge-doped n-type contact layer of GaN, which has an average carrier concentration of $1\times10^{19}$ cm$^{-3}$, a 12.5 nm thick n-type clad layer of $In_{0.1}Ga_{0.9}N$, a light-emitting layer having a multiple quantum well structure, in which a 16 nm thick barrier layer of GaN and a 2.5 nm thick well layer of $In_{0.2}Ga_{0.8}N$ were alternately formed five times and finally the barrier layer was formed, and a 0.15 µm thick p-type contact layer of Mg-doped (concentration: $8\times10^{19}/cm^3$) $Al_{0.03}Ga_{0.97}N$ were sequentially formed thereon to obtain a gallium nitride-based compound semiconductor layer on the substrate.

These layers were stacked using a conventional MOCVD method.

In the production of a light emitting device, a 0.25 µm thick indium tin oxide (ITO) film was formed on a surface of the gallium nitride-based compound semiconductor layer using a sputtering system to obtain a transparent electrode. Using known lithographic and ITO etching techniques, the indium tin oxide (ITO) film portion was formed into a predetermined rectangular shape. In that case, in a direction of each side of the rectangular shape, longitudinal and lateral directions of the light emitting device were arranged so that a long side of a rectangle is in parallel to A-plane (11-20) of a GaN crystal in consideration of a plane direction of a c-plane sapphire substrate.

Subsequently, a resist protective film was formed by a known lithographic technique for the purpose of protecting the rectangular transparent conductive film thus formed.

Using an RIE system, an n-type contact layer of a boundary portion of each light emitting device and a negative electrode forming region (portions of which are not protected with a resist) was exposed.

Subsequently, a negative electrode was formed on the n-type contact layer of the negative electrode forming region by a known lithographic technique. Similarly, a positive electrode bonding pad was formed on a transparent electrode by a known lithographic technique. Both negative electrode and positive electrode bonding pads have a structure of Cr (400 Å)/Ti (1,000 Å)/Au (10,000 Å) formed from the semiconductor layer side, and these layers were stacked by a known deposition technique.

Figure 5:
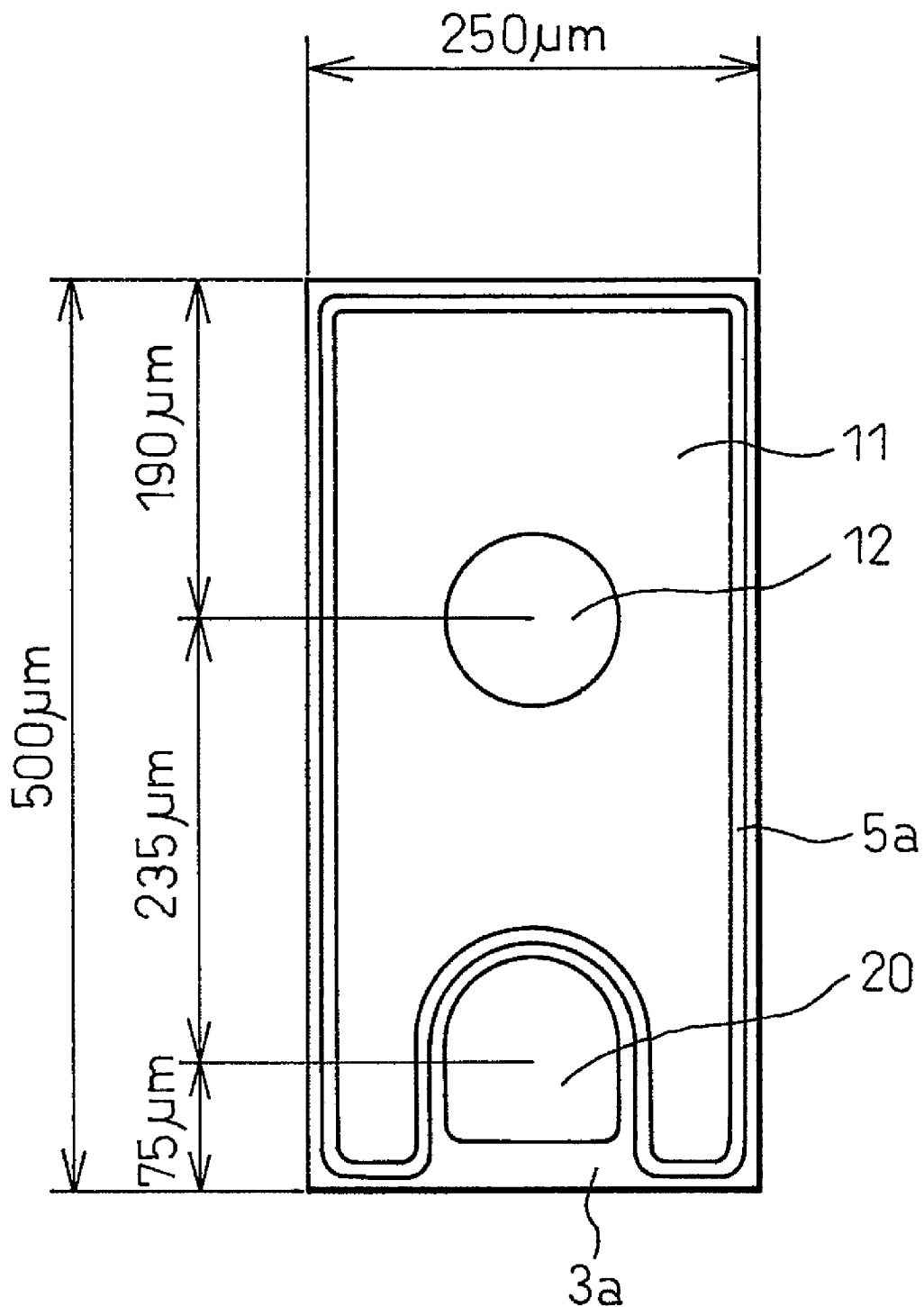
FIG. 5 is a schematic view showing a plane configuration of an electrode of a gallium nitride-based compound semiconductor light emitting device produced in Example 1.

FIG. 5 is a schematic view showing a plane configuration of an electrode of a gallium nitride-based compound semiconductor light emitting device produced in Example 1. The light emitting device has an external form of a rectangle having a short side of 250 µm and a long side of 500 µm, and a positive electrode bonding pad is located in the center of the long side and a distance between positive electrode bonding pad and the negative electrode was 235 µm. The positive electrode bonding pad has a diameter of 95 µm.

After the completion of the step of producing an electrode on each light emitting device, a photoresist used for a lithograph is applied on a wafer. Then, the substrate was exposed only at the boundary portion of each light emitting device using a lithograph.

As means for removing a gallium nitride-based compound semiconductor layer so as to reach the substrate, laser was used. First, a split groove having a depth of 20 µm was formed in an X axis direction on the substrate using laser under the conditions of a wavelength of 266 nm, a frequency of 50 kHz, an output of 1.6 W and a machining speed of 70 mm/second. After rotating a stage by 90°, a split groove was similarly formed in a Y axis direction. A width of the split groove was 2 µm.

After forming the split groove, the substrate was subjected to wet etching by immersing in a quartz beaker containing orthophosphoric acid heated to 240° C. using a heater for 20 minutes. The amount of the gallium nitride-based compound semiconductor layer etched was 5.2 µm. After the completion of wet etching, substrate and the gallium nitride-based compound semiconductor layer were washed with water in ultrasonic wave and then an etching mask made of a resist was removed by organic washing.

After the completion of the etching treatment, the substrate and the gallium nitride-based compound semiconductor layer were thinned to a substrate thickness of 80μ by grinding the substrate side, followed by separation into each light emitting device using a braking system.

The output of each separated light emitting device was evaluated by an integrating sphere. As a result, the output was 7.1 mW when 20 mA was applied. The drive voltage was measured. As a result, it was 3.35 V when 20 mA was applied.

The side surface of the light emitting device was observed by SEM. As a result, although the side surface of the sapphire substrate is vertically split, an angle (θ) of 70° is subtended between the side surface of the gallium nitride-based compound semiconductor layer and the principal surface of the substrate, as shown in FIG. 1. Regarding the shape of the side surface of the light emitting device, as shown in FIG. 6, the side surface was nearly flat at the short side, whereas, unevenness was observed at the long side.

Example 2

In the same manner as in Example 1, except that the position of the positive electrode bonding pad varied, a gallium nitride-based compound semiconductor light emitting device was produced and the resultant light emitting device was evaluated in the same manner as in Example 1 and a relation between the distance between the positive electrode bonding pad and the negative electrode, and the characteristics of the light emitting device was examined.

The results are shown in FIG. 7. As is apparent from the drawing, the emission output gradually increases as the distance between the positive electrode bonding pad and the negative electrode increases. It is also apparent that the drive voltage also increases as the distance between the positive electrode bonding pad and the negative electrode increases and, when the distance exceeds 250 μm, an increase rate increases. In view of balance between emission output and drive voltage, positive electrode bonding pad is preferably located in the vicinity of the center of the long side of the light emitting device.

Example 3

A gallium nitride-based compound semiconductor light emitting device was produced in the same manner as in Example 1, except that longitudinal and lateral directions of the light emitting device were arranged so that the long side of the rectangle is in parallel to M-plane (10-10) of a GaN crystal.

The resultant light emitting device was evaluated in the same manner as in Example 1. As a result, the output was 6.4 mW when 20 mA was applied and the drive voltage was 3.30 V. The side surface of the light emitting device was observed by SEM. As a result, regarding the side surface of the gallium nitride-based compound semiconductor layer, as shown in FIG. 1, an angle (θ) between the side surface and the principal surface of the substrate was 70°. Regarding the shape of the side surface of the gallium nitride-based compound semiconductor layer, unevenness was observed at the short side, whereas, the side surface was nearly flat at the long side.

Comparative Example

A gallium nitride-based compound semiconductor light emitting device was produced in the same manner as in Example 1, except that wet etching was not carried out.

The resultant light emitting device was evaluated in the same manner as in Example 1. As a result, the output was 5.1 mW when 20 mA was applied and the drive voltage was 3.32 V. The side surface of the light emitting device was observed by SEM. As a result, the side surface of the gallium nitride-based compound semiconductor layer was vertical to the principal surface of the substrate similarly to the side surface of the substrate. Regarding the shape of the side surface of the gallium nitride-based compound semiconductor layer, the side surface was nearly flat at both short and long sides.

Industrial Applicability

Since the gallium nitride-based compound semiconductor light emitting device of the present invention has a high emission output and a planar shape thereof is a rectangular shape with vertical and longitudinal sides each having a different length, assembling into various electronic equipment can be efficiently carried out and industrial applicability is extremely great.

The invention claimed is:

1. A light emitting device comprising a sapphire substrate having a C-plane upper surface and a gallium nitride-based compound semiconductor layer formed on the upper surface of the substrate, wherein a planar projection shape of said light-emitting device is a rectangular shape with rectangular long and short sides each having a different length, said light emitting device having a side end surface at each of the rectangular long sides and a side end surface at each of the rectangular short sides, a side end surface at a rectangular long side of the gallium nitride-based compound semiconductor layer corresponds to a plane direction of A-plane in a gallium nitride single crystal lattice, and the side end surface of the rectangular long side of the gallium nitride-based compound semiconductor layer corresponding to a plane direction of A-plane is inclined with respect to a principal surface of the substrate such that a cross sectional area of the gallium nitride-based compound semiconductor layer parallel to the principle substrate surface becomes smaller towards the principle substrate surface, and wherein an angle θ between the inclined side surface of the gallium nitride-based compound semiconductor layer and a principle surface of the substrate is less than 90°.

2. The light emitting device according to claim 1, wherein the rectangular long side of the gallium nitride-based compound semiconductor layer has a length of from 50 μm to 2,000 μm.

3. The light emitting device according to claim 1, wherein the ratio of a rectangular short side to the rectangular long side of the gallium nitride-based compound semiconductor layer is from 1:10 to 4:5.

4. The light emitting device according to claim 1, wherein a positive electrode bonding pad is located in a center of the rectangular long side of the gallium nitride-based compound semiconductor layer.

5. A lamp comprising the light emitting device according to claim 1.

6. An electronic equipment comprising the lamp according to claim 5 assembled therein.

7. A machinery comprising the electronic equipment according to claim 6 assembled therein.

8. The light emitting device according to claim 1, wherein the gallium nitride-based compound semiconductor layer has a planar upper surface.

* * * * *